US009845977B2

(12) United States Patent
Bean, Jr. et al.

(10) Patent No.: US 9,845,977 B2
(45) Date of Patent: Dec. 19, 2017

(54) SYSTEMS AND METHODS FOR COMPUTER ROOM AIR CONDITIONING

(75) Inventors: John H. Bean, Jr., Wentzville, MO (US); Zhihai Gordon Dong, Chesterfield, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 520 days.

(21) Appl. No.: 14/366,759

(22) PCT Filed: Dec. 23, 2011

(86) PCT No.: PCT/US2011/067113
§ 371 (c)(1),
(2), (4) Date: Jun. 19, 2014

(87) PCT Pub. No.: WO2013/095621
PCT Pub. Date: Jun. 27, 2013

(65) Prior Publication Data
US 2015/0007596 A1     Jan. 8, 2015

(51) Int. Cl.
*F25B 5/00*     (2006.01)
*F25B 25/00*     (2006.01)
(Continued)

(52) U.S. Cl.
CPC .............. *F25B 25/005* (2013.01); *F25B 5/02* (2013.01); *F25B 25/00* (2013.01); *F25B 41/00* (2013.01);
(Continued)

(58) Field of Classification Search
CPC .. F25B 5/02; F25B 2400/0401; F25B 25/005; F25B 41/00
See application file for complete search history.

(56) References Cited

U.S. PATENT DOCUMENTS 2,133,962 A * 10/1938 Shoemaker ............... F25B 5/02
                                             137/448
3,664,150 A * 5/1972 Patterson ................... F25B 5/02
                                             62/152
(Continued)

FOREIGN PATENT DOCUMENTS

| CN | 1745282 A | 3/2006 |
|---|---|---|
| CN | 101319826 A | 12/2008 |

(Continued)

OTHER PUBLICATIONS

Extended European Search Report from corresponding European Application No. 11877867.9 dated May 6, 2016.
(Continued)

*Primary Examiner* — David Teitelbaum
(74) *Attorney, Agent, or Firm* — Lando & Anastasi, LLP

(57) ABSTRACT

A cooling system includes a condenser and first and second cooling circuits. The condenser is configured to condense refrigerant to a liquid. The first cooling circuit includes a direct expansion valve coupled to the condenser, a first evaporator coil coupled to the direct expansion valve, and a compressor coupled to the first evaporator coil. The first cooling circuit receives at least a first portion of the liquid refrigerant and output first refrigerant vapor, and the compressor receives the first refrigerant vapor and output a compressor refrigerant output to the condenser. The second cooling circuit includes a pump coupled to the condenser, an economizer valve coupled to the pump, and a second evaporator coil coupled to the economizer valve. The second cooling circuit receives at least a second portion of the liquid refrigerant and output a second vapor refrigerant to the condenser.

20 Claims, 7 Drawing Sheets

(51) Int. Cl.
*F25B 5/02* (2006.01)
*F25B 41/00* (2006.01)
*H05K 7/20* (2006.01)

(52) U.S. Cl.
CPC ....... *F25B 41/003* (2013.01); *H05K 7/20827* (2013.01); *F25B 2400/0401* (2013.01)

(56) References Cited

U.S. PATENT DOCUMENTS

| | | | | |
|---|---|---|---|---|
| 3,710,590 | A | * | 1/1973 | Kocher ................. F25B 31/002 184/6.16 |
| 4,120,173 | A | * | 10/1978 | Kimpel ................. F25B 49/027 62/181 |
| 5,410,889 | A | | 5/1995 | Sjoholm et al. |
| 6,138,467 | A | | 10/2000 | Lifson et al. |
| 2004/0003601 | A1 | * | 1/2004 | Dube ........................ F25B 5/02 62/81 |
| 2006/0042282 | A1 | | 3/2006 | Ludwig et al. |
| 2007/0033965 | A1 | | 2/2007 | Lifson et al. |
| 2008/0115515 | A1 | | 5/2008 | Bailey et al. |
| 2010/0010681 | A1 | | 1/2010 | Zugibe et al. |
| 2010/0024455 | A1 | * | 2/2010 | Butorac .................. F25B 49/02 62/225 |

FOREIGN PATENT DOCUMENTS

| | | |
|---|---|---|
| DE | 3323223 A1 | 1/1985 |
| DE | 19839477 A1 | 3/2000 |
| TW | M347545 U | 12/2008 |
| WO | 2008/144375 A2 | 11/2008 |

OTHER PUBLICATIONS

International Search Report from corresponding PCT/US2011/067113 dated Apr. 27, 2012.

* cited by examiner

SYSTEMS AND METHODS FOR COMPUTER ROOM AIR CONDITIONING

This application is a U.S. National Stage Application under 35 U.S.C. §371 from International Application No. PCT/US2011/067113, filed Dec. 23, 2011, which is hereby incorporated by reference in its entirety for all purposes.

BACKGROUND

Heat produced by electronic equipment can have adverse effects on the performance, reliability and useful life of the equipment, so heat control can be critical to reliable operation. One environment where heat control may be critical is a data center containing racks of electronic equipment, such as servers and CPUs. A data center may contain hundreds of, such racks. To address the heat generated by electronic equipment, such as the rack-mounted electronic equipment of a modern data center, air cooling devices have been used to provide a flow of cool air to the electronic equipment. In the data center environment, such cooling devices may be referred to as computer room air conditioner ("CRAC") units. These CRAC units intake warm air from the data center and output cooler air into the data center. The electronic equipment in a typical rack is cooled as the cool air is drawn into the rack and over the equipment. The air is heated by this process and exhausted out of the rack.

Air conditioning units in a data center or computer room are a major source of energy consumption. Attempts to increase the efficiency of a CRAC unit have focused on using external water or air for cooling. Water-based cooling generally involves water flow either overhead or under the floor. Air-based cooling brings outside air into the data center.

SUMMARY

Systems and methods are provided for increasing the efficiency of a CRAC unit using a refrigeration economizer. According to one aspect, systems and methods are provided for increasing the efficiency of a CRAC unit without using external water. In another aspect, systems and methods are provided for increasing the efficiency of a CRAC unit without using external air.

According to one aspect, a cooling system includes a condenser configured to condense refrigerant to a liquid, a first cooling circuit and a second cooling circuit. The first cooling circuit includes a direct expansion valve coupled to the condenser, a first evaporator coil coupled to the direct expansion valve, and a compressor coupled to the first evaporator coil, and the first cooling circuit is configured to receive at least a first portion of the liquid refrigerant and output first refrigerant vapor, and the compressor is configured to receive the first refrigerant vapor and output a compressor refrigerant output to the condenser. The second cooling circuit, includes a pump coupled to the condenser, an economizer valve coupled to the pump and second evaporator coil coupled to the economizer valve, and the second cooling circuit is configured to receive at least a second portion of the liquid refrigerant and output a second vapor refrigerant to the condenser.

According to one embodiment, the cooling system includes a throttling valve coupled to the compressor and configured to regulate a pressure of the compressor refrigerant output. According to another embodiment, the economizer valve of the second cooling circuit is configured to divert a selected portion of the liquid refrigerant from the first cooling circuit to the second cooling circuit. According to a further embodiment, the direct expansion valve is configured to regulate the first portion of the liquid refrigerant.

In one embodiment, the pump is configured to pump the liquid refrigerant from the condenser to the first and second evaporator coils. In another embodiment, the second refrigerant is at least one of a saturated vapor and a superheated vapor. In a further embodiment, the cooling system includes a buffer, coupled to the first cooling circuit and the second cooling circuit, configured to combine the compressor refrigerant output and the second refrigerant and output combined refrigerant vapor to the condenser.

According to another aspect, a method of cooling includes providing a first portion of a liquid refrigerant to a first cooling circuit, wherein the first cooling circuit includes a direct expansion valve, a first evaporator coil, and a compressor, providing a second portion of a liquid refrigerant to a second cooling circuit, wherein the second cooling circuit includes a liquid pump, an economizer valve and a second evaporator coil, regulating, at the direct expansion valve, the first portion of liquid refrigerant provided to the first evaporator coil, outputting, from the first evaporator coil, a first vapor refrigerant to the compressor, compressing, at the compressor, the first vapor refrigerant and outputting a third vapor refrigerant to a condenser, regulating, at the economizer valve, the second portion of liquid refrigerant provided to the second evaporator coil, and outputting, from the second evaporator coil, a second vapor refrigerant to the condenser.

According to one embodiment, the method also includes combining the second refrigerant with the third vapor refrigerant at a buffer. According to another embodiment, the method includes regulating the third vapor refrigerant at a throttling valve. According to a further embodiment, regulating includes regulating at least one of a pressure and a temperature of the third vapor refrigerant. In another embodiment, the method includes regulating, at the economizer valve, the volume of the second portion of the liquid refrigerant provided to the second evaporator coil. In a further embodiment, the method includes regulating, at the direct expansion valve, the volume of the first portion of the liquid refrigerant provided to the first evaporator coil.

According to another embodiment, a cooling system includes a condenser, a first cooling circuit, a second cooling circuit configured to receive at least a second portion of a liquid refrigerant, and means for regulating a second portion of a liquid refrigerant. The condenser is configured to condense refrigerant to a liquid. The first cooling circuit includes a direct expansion valve coupled to the condenser, a first evaporator coil coupled to the direct expansion valve, and a compressor coupled to the first evaporator coil. The first cooling circuit is configured to receive at least a first portion of the liquid refrigerant and output first refrigerant vapor, and the compressor is configured to receive the first refrigerant vapor and output a compressor refrigerant output to the condenser. The second cooling circuit includes a second evaporator coil coupled to the condenser. The second cooling circuit is configured to receive at least a second portion of the liquid refrigerant and output a second refrigerant vapor to the condenser.

According to one embodiment, the means for regulating the second portion of the liquid refrigerant is an economizer valve. According to another embodiment, the means for regulating the second portion of the liquid refrigerant regulates the volume of the second portion of the liquid refrigerant. According to a further embodiment, the means for regulating the second portion of the liquid refrigerant is configured to divert a selected portion of the liquid refrigerant from the first cooling circuit to the second cooling circuit.

In one embodiment, the cooling system includes a throttling valve coupled to the compressor, and the throttling valve is configured to regulate a pressure of the compressor refrigerant output. In another embodiment, the second refrigerant vapor is at least one of a saturated vapor and a superheated vapor. In a further embodiment, the cooling system includes a buffer, coupled to the first cooling circuit and the second cooling circuit, and configured to combine the compressor refrigerant output and the second refrigerant vapor and output combined refrigerant vapor to the condenser.

BRIEF DESCRIPTION OF THE FIGURES

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
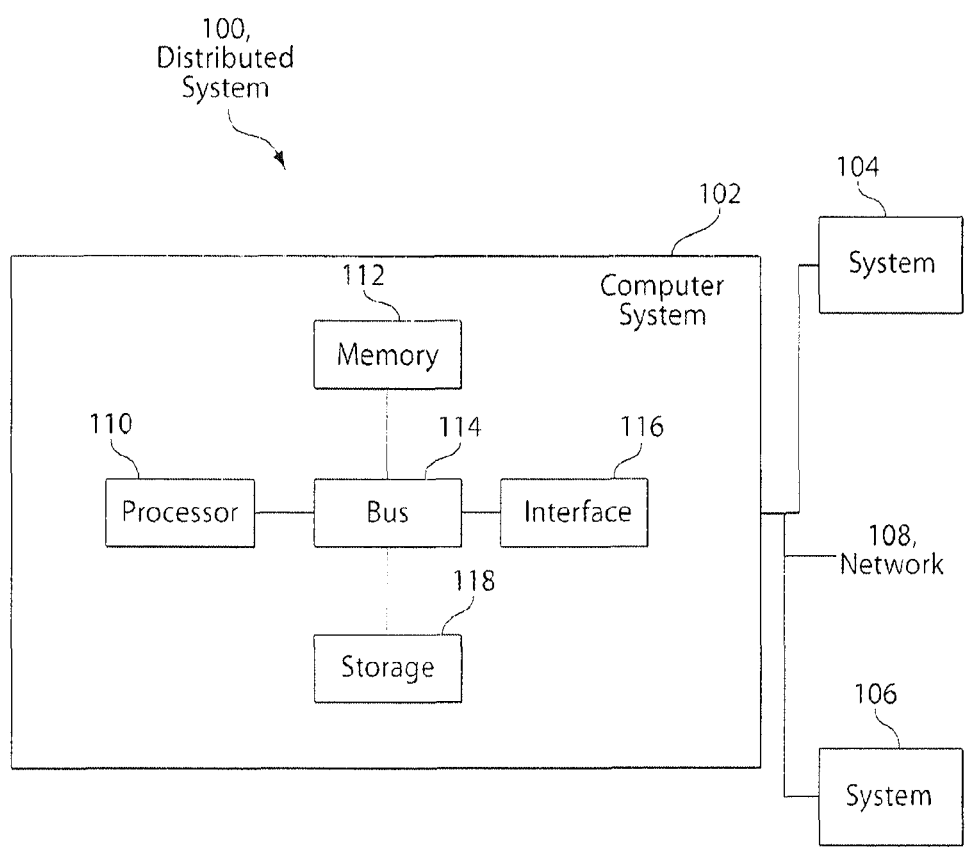
FIG. 1 is a block diagram of one example of a computer system with which various aspects in accord with the present invention may be implemented.

At least some embodiments in accordance with the present invention relate to systems and methods for increasing the efficiency of a CRAC unit using a refrigeration economizer. These systems and methods may increase efficiency of a CRAC unit without using external water or air. In various examples, systems and methods of computer room air conditioning may include direct expansion of a compressor, use of an economizing circuit, and use of a throttling valve. According to one aspect, a CRAC unit may run in one of several modes, and the most efficient mode at a particular time may depend on the temperature of the ambient air.

The aspects and embodiments of the present invention disclosed herein are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, operating a CRAC unit in a selected mode, and selecting the most efficient mode for operating a CRAC unit. Further, computer systems in embodiments may be used to automatically measure environmental parameters in a data center, and control equipment, such as chillers or coolers to optimize performance. Moreover, the systems described herein may be configured to include or exclude any of the functions discussed herein. Thus the embodiments are not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present embodiments may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accordance with the present embodiments may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the embodiments are not limited to executing on any particular system or group of systems. Further, aspects may be implemented in software, hardware or firmware, or any combination thereof. Thus, aspects in accordance with the present embodiments may be implemented within methods, acts, systems, system elements and components using a variety of hardware and software configurations, and the embodiments are not limited to any particular distributed architecture, network, or communication protocol.

FIG. 1 shows a block diagram of a distributed computer system 100, in which various aspects and functions in accord with the present embodiments may be practiced. Distributed computer system 100 may include one more computer systems. For example, as illustrated, distributed computer system 100 includes computer systems 102, 104, and 106. As shown, computer systems 102, 104, and 106 are interconnected by, and may exchange data through, communication network 108. Network 108 may include any communication network through which computer systems may exchange data. To exchange data using network 108, computer systems 102, 104, and 106 and network 108 may use various methods, protocols and standards, including, among others, token ring, Ethernet, wireless Ethernet, Bluetooth®, TCP/IP, UDP, Http, FTP, SNMP, SMS, MMS, SS7, Json, Soap, and Corba. To ensure data transfer is secure, computer systems 102, 104, and 106 may transmit data via network 108 using a variety of security measures including TLS, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present embodiments may be implemented as specialized hardware or software executing in one or more computer systems including computer system 102 shown in FIG. 1. As depicted, computer system 102 includes processor 110, memory 112, bus 114, interface 116, and storage 118. Processor 110 may perform a series of instructions that result in manipulated data. Processor 110 may be a commercially available processor, such as an Intel Pentium®, Motorola PowerPC®, SGI MIPS®, Sun UltraSPARC®, or Hewlett-Packard PA-RISC® processor, but may be any type of processor, multi-processor, microprocessor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory, such as a dynamic random access memory (DRAM) or static memory (SRAM). However, memory 112 may include any device for storing data, such as a disk drive or other non-volatile, non-transitory, storage device. Various embodiments in accordance with the present invention may organize memory 112 into particularized and, in some cases, unique structures to perform the aspects and functions disclosed herein.

Components of computer system 102 may be coupled by an interconnection element, such as bus 114. Bus 114 may include one or more physical busses, for example, busses between components that are integrated within a same machine, but may include any communication coupling between system elements including specialized or standard computing bus technologies, such as IDE, SCSI, PCI and InfiniBand. Thus, bus 114 enables communications, for example, data and instructions, to be exchanged between system components of computer system 102.

Computer system 102 also includes one or more interface devices 116, such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, and network interface cards. Interface devices allow computer system 102 to exchange information and communicate with external entities, such as users and other systems.

Storage system 118 may include a computer readable and writeable, nonvolatile, non-transitory, storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk, or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then may copy the data to the medium associated with storage system 118 after processing is completed. A variety of components may manage data movement between the medium and integrated circuit memory element and the presently described embodiments are not limited thereto. Further, the embodiments are not limited to a particular memory system or data storage system.

Although computer system 102 is shown by way of example as one type of computer system upon which various aspects and functions in accordance with the present embodiments may be practiced, any aspects of the presently disclosed embodiments are not limited to being implemented on the computer system as shown in FIG. 1. Various aspects and functions in accord with the presently disclosed embodiments may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS® System X with Motorola PowerPC® processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows®-based operating system, such as Windows NT®, Windows 2000® (Windows ME®), Windows XP®, or Windows Vista® operating systems, available from the Microsoft® Corporation, a MAC OS® System X operating system available from Apple® Computer, one of many Linux®-based operating system distributions, for example, the Enterprise Linux® operating system available from Red Hat Inc.®, a Solaris® operating system available from Sun Microsystems®, or a UNIX® operating system available from various sources. Many other operating systems may be used, and embodiments are not limited to any particular implementation.

The processor and operating system together define a computer platform for which application programs in high-level programming languages may be written. These component applications may be executable, intermediate, for example, C-, bytecode or interpreted code which communicates over a communication network, for example, the Internet, using a communication protocol, for example, TCP/IP. Similarly, aspects in accord with the presently disclosed embodiments may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the presently disclosed embodiments may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the presently disclosed embodiments are not limited to a specific programming language and any suitable programming language could also be used.

A computer system included within an embodiment may perform additional functions outside the scope of the presently disclosed embodiments. For instance, aspects of the system may be implemented using an existing commercial product, such as, for example, Database Management Systems, such as SQL Server available from Microsoft® of Seattle Wash., Oracle® Database from Oracle of Redwood Shores, Calif., and MySQL from MySQL AB, a subsidiary of Oracle or integration software such as Web Sphere® middleware from IBM® of Armonk, N.Y. However, a computer system running, for example, SQL Server may be able to support both aspects in accord with the presently disclosed embodiments and databases for sundry applications.

Example System Architecture

Figure 2:
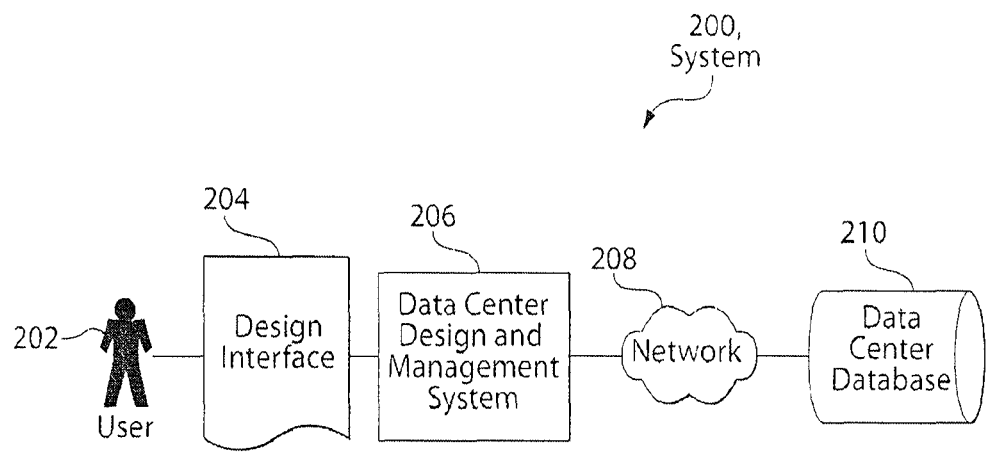
FIG. 2 a schematic of one example of a distributed system including a data center management system.

FIG. 2 presents a context diagram including physical and logical elements of distributed system 200. As shown, distributed system 200 is specially configured in accordance with the presently disclosed embodiments. The system structure and content recited with regard to FIG. 2 is for exemplary purposes only and is not intended to limit the embodiments to the specific structure shown in FIG. 2. As will be apparent to one of ordinary skill in the art, many variant system structures can be architected without deviating from the scope of the presently disclosed embodiments. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the presently disclosed embodiments.

Referring to FIG. 2, system 200 includes user 202, interface 204, data center design and management system 206, communications network 208, and data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, titled "Methods and Systems for Managing Facility Power and Cooling," filed on May 15, 2008 and assigned to American Power Conversion Corporation, the assignee of the instant application. Patent Cooperation Treaty Application No. PCT/US08/63675 is incorporated herein by reference in its entirety and is hereinafter referred to as PCT/US08/63675. In other embodiments, interface 204 may be implemented with specialized facilities that enable user 202 to design, in a drag and drop fashion, a model that includes a representation of the physical layout of a data center or any subset thereof. This layout may include representations of data center structural components as well as data center equipment. The features of interface 204, as may be found in various embodiments in accordance with the present invention, are discussed further below. In at least one embodiment, information regarding a data center is entered into system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information needed to support the features and functions of data center design and management system 206. For example, in one embodiment, data center database 210 may include at least some portion of the data stored in the data center equipment database described in PCT/US08/63675. In another embodiment, this information may include any information needed to support interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

In one embodiment, data center database 210 may store types of cooling providers, the amount of cool air provided by each type of cooling provider, and a temperature of cool air provided by the cooling provider. Thus, for example, data center database 210 includes records of a particular type of CRAC unit that is rated to deliver airflow at the rate of 5,600 cubic feet per minute (cfm) at a temperature of 68 degrees Fahrenheit. In addition, the data center database 210 may store one or more cooling metrics, such as inlet and outlet temperatures of the CRAC units and inlet and exhaust temperatures of one or more equipment racks. The temperatures may be periodically measured and input into the system, or in other embodiments, the temperatures may be continuously monitored using devices coupled to the system 200.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts.

Thus, embodiments of the invention are not limited to a specific number of users or systems.

Computer Room Air Conditioner Examples

Figure 3:
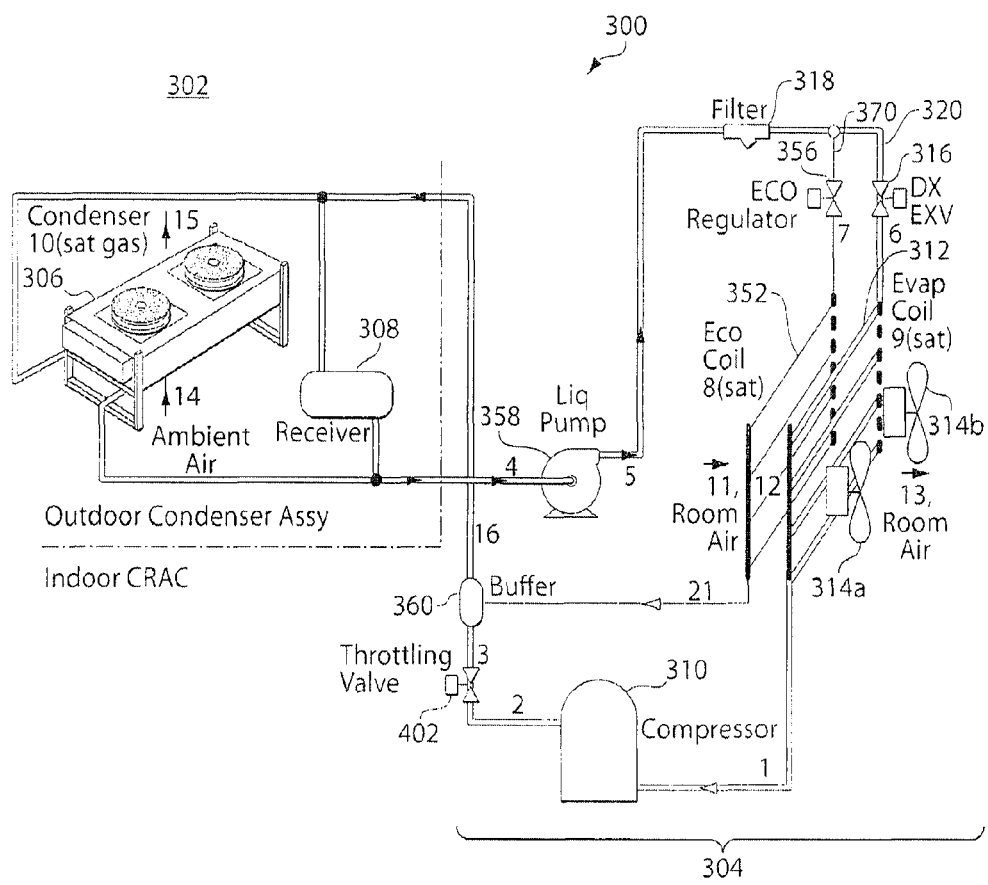
FIG. 3 is a schematic diagram of a computer room air conditioner unit according to aspects of the invention.

FIG. 3 is a schematic diagram of a computer room air conditioner unit 300, including an outdoor condenser assembly 302 and an indoor CRAC unit 304 in fluid communication with the outdoor condenser assembly. The outdoor condenser assembly 302 includes a condenser 306 and a receiver 308 having a supply of refrigerant. The indoor CRAC unit 304 includes a liquid pump 358, a primary refrigerant circuit and a refrigerant secondary circuit both in fluid communication with the liquid pump, and a compressor 310 in fluid communication with the primary circuit. In one embodiment, the primary circuit includes a line 320 leading from the liquid pump 358 to a direct expansion valve 316, which in turn controls the delivery of reduced-pressure refrigerant to evaporator coils 312. The secondary circuit includes line 356 leading from the liquid pump 358 to a regulator valve 356, which in turn controls the delivery of liquid refrigerant to evaporator coils 352. The indoor CRAC unit further includes fans 314a, 314b, which are provided to move air over the first and second evaporator coils 312, 352 of the respective primary and secondary circuits. A filter 318 is disposed between the liquid pump 358 and the primary and secondary circuits to filter the refrigerant prior to entering the primary and secondary circuits. A throttling valve 402 is provided downstream from the compressor 310 to control the pressure of refrigerant from the compressor. A buffer 360 is further provided to mix refrigerant delivered by the primary and secondary circuits prior to returning to the outdoor condenser assembly 302.

The CRAC unit 300 operates in a first mode shown in FIG. 3 when the condensing temperature is above room air return temperature. In the first mode, the cooling capacity of the CRAC unit 300 is controlled by the primary circuit including the direct expansion valve 316, the evaporator coils 312, and the compressor 310. The flow of refrigerant through the CRAC unit 300, as described below, is illustrated by bold lines in FIGS. 3-6 with respect to various modes of the CRAC unit.

According to one embodiment, in the first mode, as shown in FIG. 3, the condenser 306 of the outdoor condenser assembly 302 receives refrigerant and converts it to liquid form. From the condenser 306, the liquid pump 358 drives the movement of the liquid refrigerant to the direct expansion valve line 320. In this embodiment, the regulator valve 356 is in a closed position. The direct expansion valve 316 reduces and expands the refrigerant and regulates the amount of refrigerant that flows to the evaporator coils 312. The refrigerant is converted to a vapor at the evaporator coils 312, and the vapor refrigerant flows from the evaporator coils 312 to the compressor 310. The compressor 310 decreases the volume of the vapor refrigerant, thereby increasing its pressure and temperature. The vapor refrigerant flows from the compressor 310 back to the condenser 306. According to one example, the throttling valve 402 and the buffer 360 are not used in the first mode, and the refrigerant flows directly through them. The condenser 306 converts the refrigerant back to liquid form. From the condenser 306, the liquid refrigerant flows back to the direct expansion valve 316 and the cycle begins again. The receiver 308, which is connected in parallel with the condenser 306, accumulates refrigerant. Inside the data center, fans 314a, 314b draw air across the evaporator coils 312, to cool the air temperature.

Figure 4:
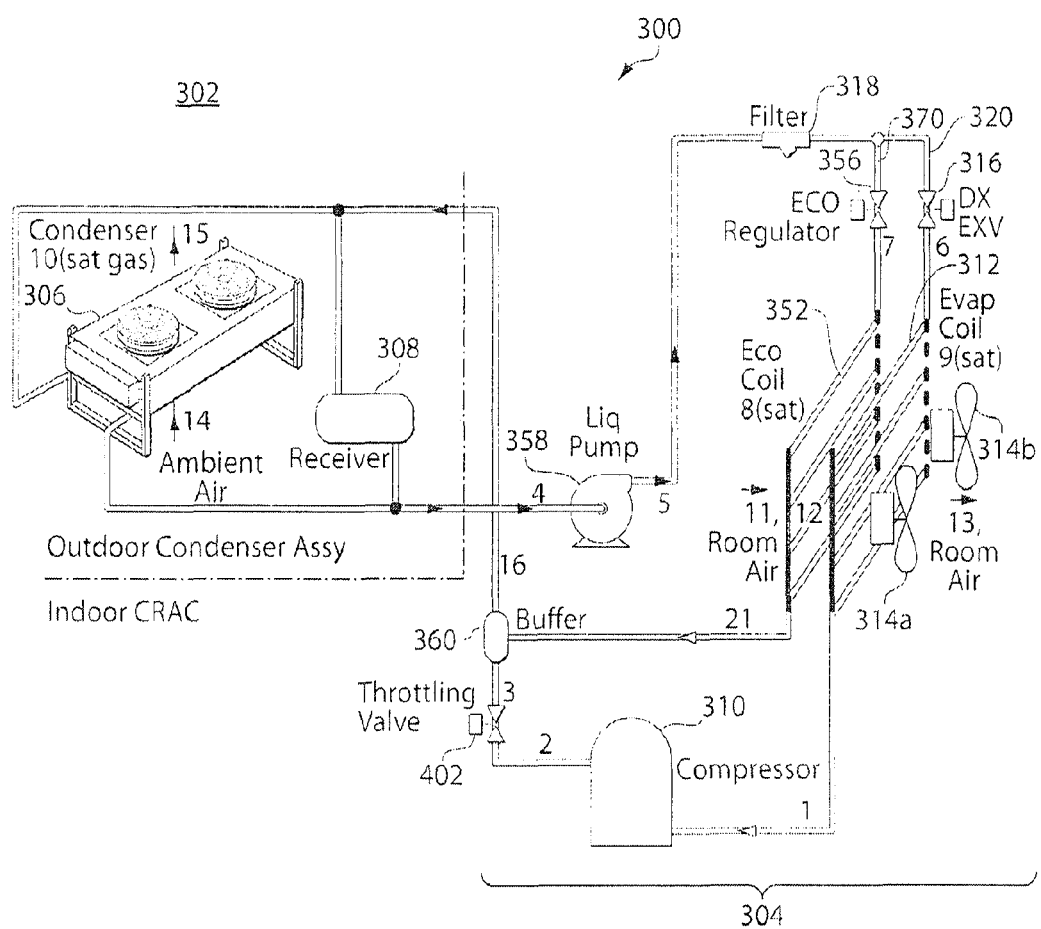
FIG. 4 is a schematic diagram of a computer room air conditioner unit according to aspects of the invention.

FIG. 4 is a schematic diagram of the computer room air conditioner unit 300 operating in a second mode. According to one embodiment, the CRAC unit 300 operates in the second mode when the condensing temperature drops below room air return temperature. In the second mode, the refrigerant flows through two parallel evaporator coil lines—the direct expansion valve line 320 and an economizer line 370—that lead to the primary and secondary circuits. The direct expansion valve line 320 of the primary circuit functions as described above with respect to the first mode in FIG. 3. However, some of the refrigerant is diverted to the economizer line 370 of the secondary circuit. According to one feature, the economizer line 370 of the secondary circuit provides a more economical (more energy efficient) cooling environment than the direct expansion valve line 310 of the primary circuit. Furthermore, using the economizer line 370 of the secondary circuit decreases the amount of refrigerant that flows through the direct expansion valve 316, evaporator coils 312, and the compressor 310 of the primary circuit, which decreases energy use of the CRAC unit 300.

As shown in FIG. 4, the condenser 306 receives vaporized refrigerant and converts it to a liquid refrigerant. The liquid refrigerant flows to a liquid pump 358, which boosts the flow of the refrigerant from the condenser to the filter 318. From the filter 318, the refrigerant line splits into two parallel lines. The direct expansion valve line 320 functions as described above with respect to the first mode in FIG. 3. The other line is the economizer line 370, which begins with a regulator valve 356 that allows a selected amount of the refrigerant through the economizer line 370. The refrigerant flows from the regulator valve 356 to the second set of evaporator coils 352 as a liquid. The heated fully vaporized refrigerant flows directly from the second set of evaporator coils 352 to a buffer 360, where the heated fully vaporized refrigerant mixes with the vaporized refrigerant from the primary circuit. While in one embodiment, the refrigerant output from the coil 352 is saturated pure vapor, in other embodiments, the refrigerant output from the coil 352 is vapor that is superheated by several degrees.

According to one embodiment, the direct expansion valve line 320 of the primary circuit outputs refrigerant vapor from the compressor 310 to the buffer 360. At the buffer 360, the refrigerant vapor from the compressor 310 is combined with the heated vaporized refrigerant from the economizer line 370. According to one embodiment, the throttling valve 402 is not used in the second mode, and the output from the compressor 310 flows directly to the buffer 360. The buffer 360 equalizes the pressure of the refrigerant vapor from the primary circuit and the heated refrigerant from the secondary circuit, which flows back to the condenser 306. Inside the data center, fans 314a, 314b draw air across the second set of evaporator coils 352 and then across the first set of evaporator coils 312, to cool the air temperature in the data center.

Figure 5:
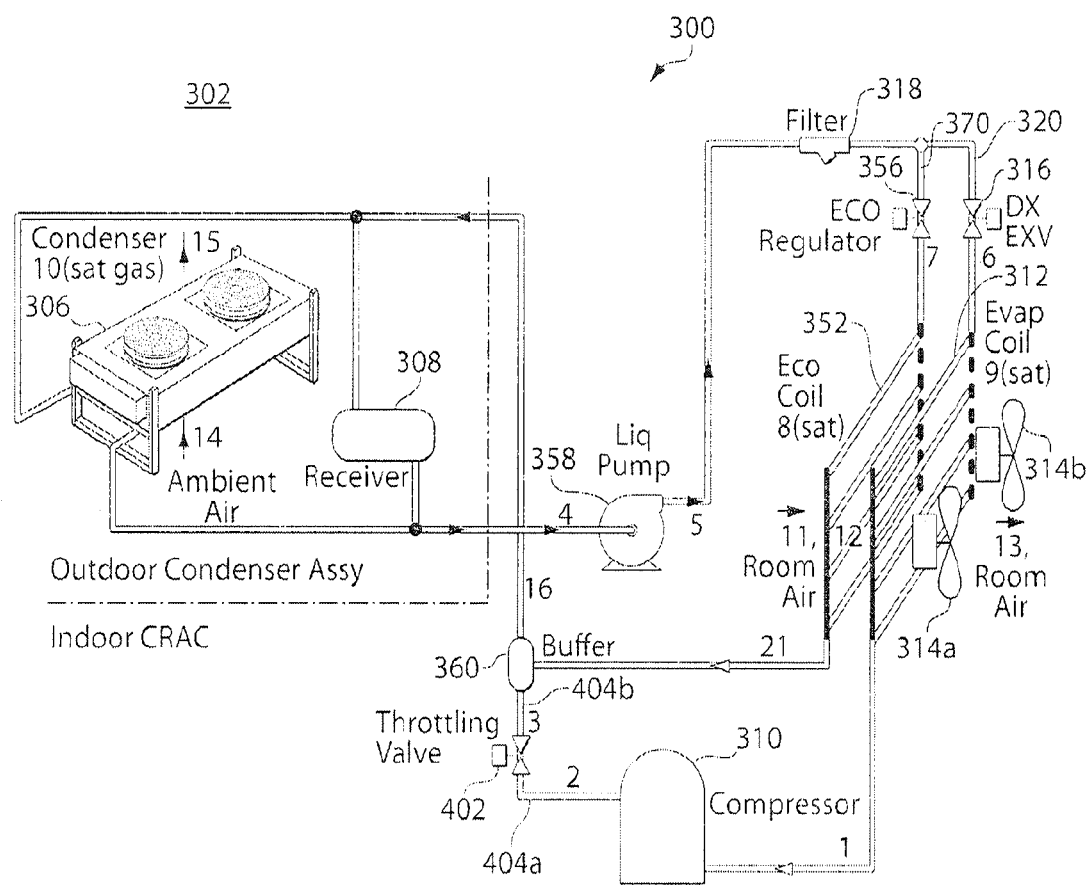
FIG. 5 is a schematic diagram of a computer room air conditioner unit according to aspects of the invention.

FIG. 5 is a schematic diagram showing the CRAC unit 300 operating in a third mode. According to one embodiment, the CRAC unit 300 operates in the third mode when the condensing temperature drops to (or below) the minimum condensing temperature of the compressor 310. The third mode includes the use of the throttling valve 402 to prevent malfunction of the compressor 310, which can occur with the condensing temperature drops below the minimum condensing temperature of the compressor 310. In particular, when the condensing temperature drops below the minimum condensing temperature of the compressor 310, the pressure at the output of the compressor 310 can decrease below a minimum functional level thereby resulting in a potential malfunction and/or catastrophic failure of the compressor 310. Thus, when the condensing temperature reaches the minimum condensing temperature of the compressor 310, the throttling valve 402 begins to regulate the pressure at the output of the compressor 310 to ensure the pressure remains high enough for proper function of the compressor 310. Maintaining a sufficiently high pressure will ensure that the temperature remains at or above the minimum condensing temperature. According to one example, the pressure on the buffer-side 404b of the throttling valve 402 may be lower than the pressure on the compressor-side 404a of the throttling valve 402.

In one embodiment, the throttling valve 402 may be replaced with a turbo expander. According to one feature, a turbo expander may recover some work from the pressure change. According to one embodiment, the minimum condensing temperature of the compressor 310 may be predetermined and specified by the manufacturer of the compressor 310.

According to one embodiment, a fourth mode of operation is used when the condensing temperature drops and the running speed of the compressor 310 is reduced to its minimum. When the running speed of the compressor 310 is at the minimum allowed speed (as predetermined by the manufacturer), the compressor 310 remains running at the minimum speed. In the fourth mode, the cooling capacity of the CRAC unit 400 is then controlled by limiting the flow of refrigerant through the economizer line 370 of the secondary circuit. For example, to decrease the cooling capacity of the CRAC unit 400 when the compressor 310 is running at the minimum speed, less refrigerant flows through the economizer line 370.

Figure 6:
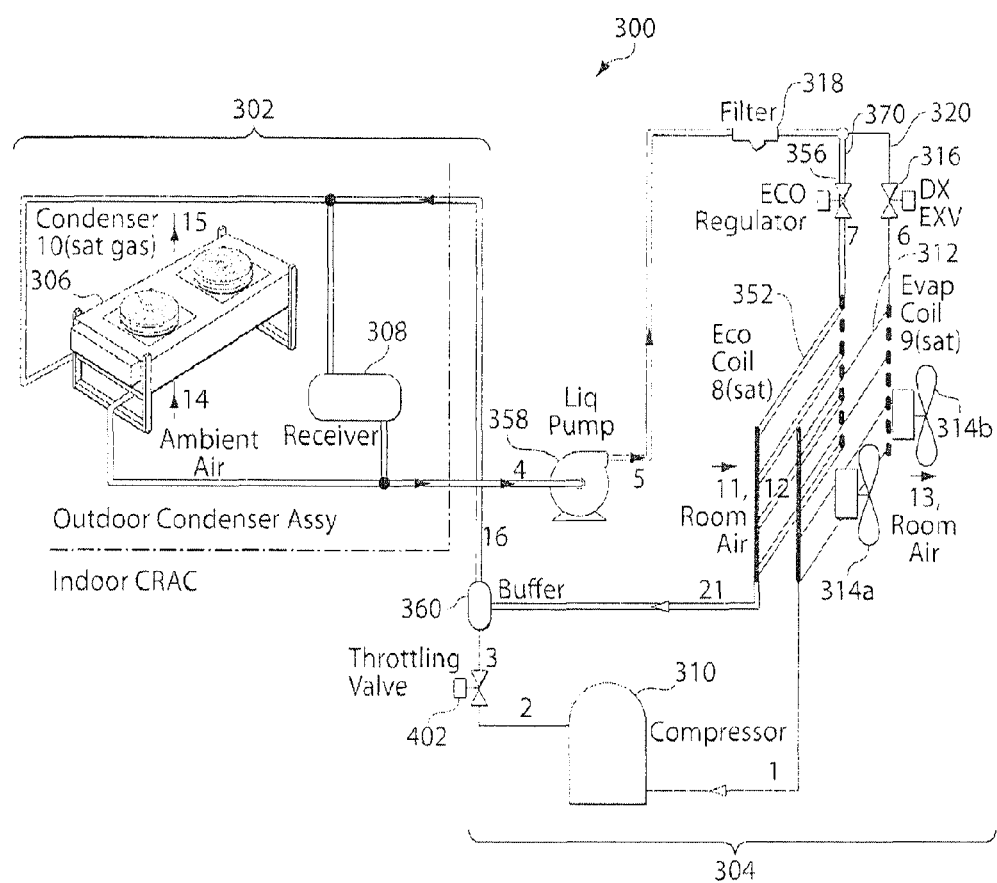
FIG. 6 is a schematic diagram of a computer room air conditioner unit according to aspects of the invention.

FIG. 6 is a schematic diagram of the CRAC unit 300 operating in a fifth mode. In the fifth mode, the direct expansion valve line 320 is shut off by closing the direct expansion valve 316. According to one embodiment, the CRAC unit 300 operates in the fifth mode when the condensing temperature is reduced enough to cool the data center using the economizer line 370 alone. The economizer line 370 operates as described above with respect to FIGS. 4-5. In one embodiment, the CRAC unit 300 operates in a sixth mode when ambient temperature drops enough to shut off the fans of the condenser 306 while the condenser 306 retains its heat rejection capacity.

As described above, the CRAC unit 300 functions in six different modes of operation. The CRAC unit 300 operates in the most energy-efficient mode possible given the temperature of the ambient air entering into the condenser 306 in which it is installed. In this manner, the CRAC unit 300 maximizes efficiency. In one example, when the temperature of the air in a data center is hot, and the condensing temperature is above room air return temperature, the CRAC unit 300 operates in the first mode, as described with respect to FIG. 3. In the first mode, the economization line of the secondary circuit is not used. In the second mode, the condensing temperature drops below room temperature, and the economization line 370 of the secondary circuit is used in parallel with the direct expansion valve line 310 of the primary circuit. In the third mode, the ambient air temperature is further reduced, and the condensing temperature is reduced to the minimum condensing temperature, and the throttling valve 402 is used to maintain the compressor output pressure at a minimum level. In a fourth mode, the ambient air temperature is reduced even further and the compressor is running at its minimum allowed speed, and the cooling capacity of the CRAC unit is controlled by limiting the flow of refrigerant through the economizer line 370. In the fifth mode, the ambient air temperature, and the condensing temperature, is reduced enough to shut off the direct expansion valve line 320, and run the CRAC unit using the economization line 370 alone. In the sixth mode, the ambient air temperature is reduced enough to run the CRAC unit using the economization line 370 alone and also turn off the condenser fans.

Figure 7:
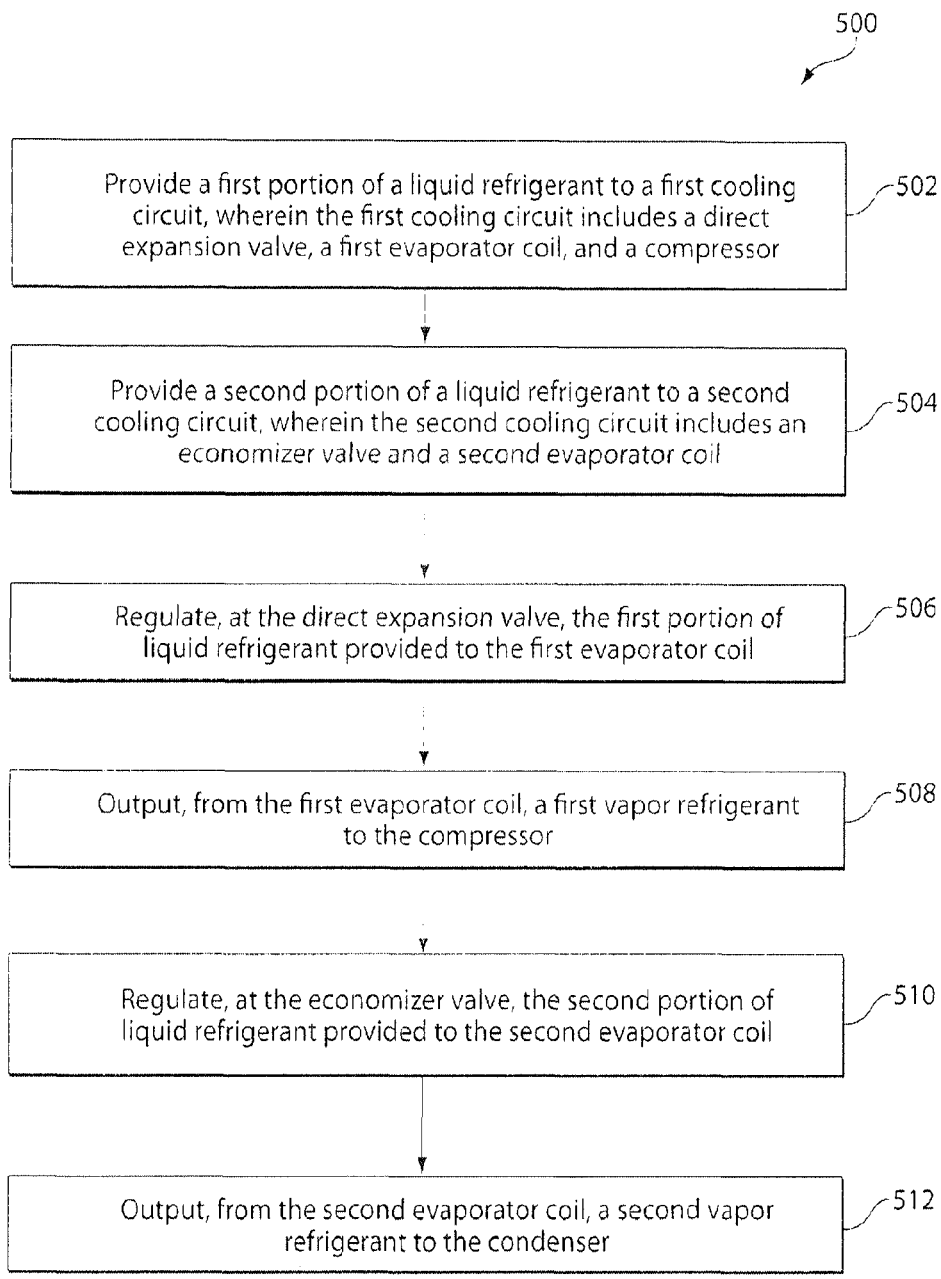
FIG. 7 is a flow chart of a method for computer room air conditioning using a refrigeration economizer.

FIG. 7 is a flow chart of a method 500 for computer room air conditioning using a refrigeration economizer. At block 502, a first portion of a liquid refrigerant is provided to a first cooling circuit. The first cooling circuit includes a direct expansion valve, a first evaporator coil and a compressor. At block 504, a second portion of a liquid refrigerant is provided to a second cooling circuit. The second cooling circuit included an economizer valve and a second evaporator coil. At block 506, the direct expansion valve regulates the first portion of the liquid refrigerant provided to the first evaporator coil. For example, the direct expansion valve may regulate the volume of the first portion of the liquid refrigerant, and the direct expansion valve may reduce and expand the first portion of the liquid refrigerant. At block 508, the first evaporator coil outputs a first vapor refrigerant to the compressor. The compressor condenses the volume of the first vapor refrigerant and outputs a third vapor refrigerant to the condenser.

At block 510, the economizer valve regulates the second portion of the liquid refrigerant provided to the second evaporator coil. For example, economizer valve may regulate the volume of the second portion of the liquid refrigerant. At block 512, the second evaporator coil outputs the second vapor refrigerant to the condenser. In one embodiment, a buffer combines the third vapor refrigerant and the second vapor refrigerant and outputs the combination to the condenser.

As described with respect to FIGS. 3-7, the CRAC unit can function in several different modes. Running a CRAC unit in the various modes was simulated, and the results are tabulated in Table 1 below. The modes in the table include direct expansion valve line only (DX only, first mode), direct expansion valve line and economization line (DX+ECO, second mode), direct expansion valve line and economization line with a throttling valve (DX+ECO w/ throttling valve, third mode), direct expansion valve line and economization line with a throttling valve and the compressor operating at a minimum speed of 30 Hz (DX+ECO w/ throttling valve and min 30 Hz, fourth mode), economization line only (ECO only, fifth mode), and economization only with the condenser fans off (ECO only with condenser fans off, sixth mode).

TABLE 1

| Working mode | DX only (Mode 1) | DX + ECO (Mode 2) | DX + ECO w/throttling val (Mode 3) | DX + ECO w/throttling val and min 30 Hz (Mode 4) | ECO Only (Mode 5) | ECO only with condenser fans off (Mode 6) |
| --- | --- | --- | --- | --- | --- | --- |
| Ambient air dry bulb T(F.) | 101 | 74.5 | 69 | 61 | 51.6 | 29 |

TABLE 1-continued

| Working mode | DX only (Mode 1) | DX + ECO (Mode 2) | DX + ECO w/throttling val (Mode 3) | DX + ECO w/throttling val and min 30 Hz (Mode 4) | ECO Only (Mode 5) | ECO only with condenser fans off (Mode 6) |
|---|---|---|---|---|---|---|
| Condensing T(F.) | 116 | 89.5 | 84 | 76 | 66.6 | 44 |
| ECO coil (kW) | 0 | 0.2 | 7.9 | 26.5 | 50 | 50 |
| Evaporator coil kW | 50 | 49.8 | 42.1 | 23.5 | 0 | 0 |
| Circuit COP | 2.8 | 4.0 | 4.8 | 7.2 | 15.4 | 36.1 |
| Compressor running (Hz) | 79.4 | 68.1 | 55.7 | 30 | 0 | 0 |
| Throttling valve | wide open | Wide open | Regulating | Regulating | N/A | N/A |
| Condenser fan running | Max | Reduce | Reduce | Reduce | Reduce | 0 |
| Liquid pump running | Yes | Yes | Yes | Yes | Yes | Yes |

The rows in the table indicate the simulated measurements of the ambient dry air bulb temperature in degrees Fahrenheit, the condensing temperature in degrees Fahrenheit, the power at the economization refrigerant coil in kilowatts (kW), the power at the direct expansion valve refrigerant coil in kilowatts, the coefficient of performance (COP) of the cooling circuit, the frequency of the compressor in Hertz, the positioning of the throttling valve, whether the condenser fan is running in the simulation, and whether the liquid pump is running in the simulation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A cooling system, comprising:
a condenser configured to condense refrigerant to a liquid refrigerant;
a pump coupled to the condenser;
a first cooling circuit, including a direct expansion valve coupled to the pump, a first evaporator coil coupled to the direct expansion valve, and a compressor coupled to the first evaporator coil, wherein the first cooling circuit is configured to receive at least a first portion of the liquid refrigerant and output a first vapor refrigerant, and the compressor is configured to receive the first vapor refrigerant and output a compressor refrigerant output to the condenser; and
a second cooling circuit, including an economizer valve coupled to the pump and second evaporator coil coupled to the economizer valve, wherein the second evaporator coil is configured to receive at least a second portion of the liquid refrigerant via the economizer valve, generate a second vapor refrigerant from the second portion of the liquid refrigerant received via the economizer valve, and output the second vapor refrigerant to the condenser, bypassing the compressor.

2. The cooling system of claim 1, further comprising a throttling valve coupled to the compressor, and configured to regulate a pressure of the compressor refrigerant output.

3. The cooling system of claim 1, wherein the economizer valve of the second cooling circuit is configured to divert a selected portion of the liquid refrigerant from the first cooling circuit to the second cooling circuit.

4. The cooling system of claim 1, wherein the direct expansion valve is configured to regulate the first portion of the liquid refrigerant.

5. The cooling system of claim 1, wherein the pump is configured to pump the liquid refrigerant from the condenser to the first and second evaporator coils.

6. The cooling system of claim 1, wherein the second vapor refrigerant is at least one of a saturated vapor and a superheated vapor.

7. The cooling system of claim 1, further comprising a buffer, coupled to the first cooling circuit and the second cooling circuit, configured to combine the compressor refrigerant output and the second vapor refrigerant and output combined refrigerant vapor to the condenser.

8. A method of cooling, comprising:
providing, via a liquid pump, a first portion of a liquid refrigerant to a first cooling circuit, wherein the first cooling circuit includes a direct expansion valve, a first evaporator coil, and a compressor;
providing, via the liquid pump and an economizer valve, a second portion of the liquid refrigerant to a second cooling circuit, wherein the second cooling circuit includes the economizer valve and a second evaporator coil;
regulating, at the direct expansion valve, the first portion of the liquid refrigerant provided to the first evaporator coil;
outputting, from the first evaporator coil, a first vapor refrigerant to the compressor;
compressing, at the compressor, the first vapor refrigerant and outputting a third vapor refrigerant to a condenser;
regulating, at the economizer valve, the second portion of the liquid refrigerant provided to the second evaporator coil;
generating, via the second evaporator coil, a second vapor refrigerant from the second portion of the liquid refrigerant provided via the liquid pump and the economizer valve; and
outputting, from the second evaporator coil, the second vapor refrigerant to the condenser, bypassing the compressor.

9. The method of claim 8, further comprising combining the second refrigerant with the third vapor refrigerant at a buffer.

10. The method of claim 8, further comprising regulating the third vapor refrigerant at a throttling valve.

11. The method of claim 10, wherein regulating includes regulating at least one of a pressure and a temperature of the third vapor refrigerant.

12. The method of claim 8, further comprising regulating, at the economizer valve, the volume of the second portion of the liquid refrigerant provided to the second evaporator coil.

13. The method of claim 8, further comprising regulating, at the direct expansion valve, the volume of the first portion of the liquid refrigerant provided to the first evaporator coil.

14. A cooling system, comprising:
a condenser configured to condense refrigerant to a liquid;
a first cooling circuit, including a direct expansion valve coupled to the condenser, a first evaporator coil coupled to the direct expansion valve, and a compressor coupled to the first evaporator coil, wherein the first cooling circuit is configured to receive at least a first portion of the liquid refrigerant and output first refrigerant vapor, and the compressor is configured to receive the first refrigerant vapor and output a compressor refrigerant output to the condenser;
a second cooling circuit, including a second evaporator coil coupled to the condenser, wherein the second evaporator coil is configured to receive at least a second portion of the liquid refrigerant, generate a second vapor refrigerant from the second portion of the liquid refrigerant, and output the second vapor refrigerant to the condenser, bypassing the compressor; and
means for regulating the second portion of the liquid refrigerant received by the second evaporator coil.

15. The cooling system of claim 14, wherein the means for regulating the second portion of the liquid refrigerant is an economizer valve.

16. The cooling system of claim 14, wherein the means for regulating the second portion of the liquid refrigerant regulates the volume of the second portion of the liquid refrigerant.

17. The cooling system of claim 14, wherein the means for regulating the second portion of the liquid refrigerant is configured to divert a selected portion of the liquid refrigerant from the first cooling circuit to the second cooling circuit.

18. The cooling system of claim 14, further comprising a throttling valve coupled to the compressor, and configured to regulate a pressure of the compressor refrigerant output.

19. The cooling system of claim 14, wherein the second refrigerant vapor is at least one of a saturated vapor and a superheated vapor.

20. The cooling system of claim 14, further comprising a buffer, coupled to the first cooling circuit and the second cooling circuit, configured to combine the compressor refrigerant output and the second refrigerant vapor and output combined refrigerant vapor to the condenser.

* * * * *